United States Patent [19]

Kawano

[11] Patent Number: 5,361,289
[45] Date of Patent: Nov. 1, 1994

[54] SYNCHRONOUS COUNTER CIRCUIT HAVING A PLURALITY OF CASCADE-CONNECTED COUNTERS

[75] Inventor: Harumi Kawano, Miyazaki, Japan

[73] Assignee: Oki Electric Industry Co., Ltd., Tokyo, Japan

[21] Appl. No.: 61,046

[22] Filed: May 14, 1993

[30] Foreign Application Priority Data

May 18, 1992 [JP] Japan ................................ 4-123988

[51] Int. Cl.⁵ ............................................ H03K 21/16
[52] U.S. Cl. ...................................... 377/44; 377/51; 377/116
[58] Field of Search ........................ 377/37, 44, 51, 55, 377/47, 56, 111, 114, 116

[56] References Cited

U.S. PATENT DOCUMENTS

| | | | |
|---|---|---|---|
| 3,745,364 | 7/1973 | Blank et al. | 328/41 |
| 3,767,902 | 10/1973 | Estes, III et al. | 377/44 |
| 3,808,407 | 4/1974 | Ratz | 377/44 |
| 4,002,926 | 1/1977 | Moyer | 377/47 |
| 4,017,719 | 4/1977 | Kaplan et al. | 377/44 |
| 4,339,722 | 7/1982 | Sydor et al. | 377/44 |
| 4,545,063 | 10/1985 | Kamimaru | 377/44 |

Primary Examiner—Timothy P. Callahan
Assistant Examiner—My-Trang Nu Ton
Attorney, Agent, or Firm—Steven M. Rabin

[57] ABSTRACT

A synchronous counter circuit comprises first and second counting circuits and a latch circuit. Each of the first and second counting circuits includes a clock terminal for receiving a clock signal, an enable terminal for receiving an enable signal, a counter coupled to the clock terminal for counting pulses of the clock signal, a carry signal generating circuit coupled to the counter for generating a carry signal in response to a finish of the counting of the counter, and a ripple carry signal generating circuit coupled to the clock terminal and the carry signal generating circuit for generating a ripple carry signal in response to the clock signal and the carry signal. The latch circuit is coupled to the carry signal generating circuit and the ripple carry signal generating circuit of the first counting circuit for generating another enable signal in response to the carry signal and the ripple carry signal which are output from the carry signal generating circuit and the ripple carry signal generating circuit of the first counting circuit. The latch circuit has an output terminal coupled to the enable terminal of the second counting circuit.

20 Claims, 3 Drawing Sheets

5,361,289

SYNCHRONOUS COUNTER CIRCUIT HAVING A PLURALITY OF CASCADE-CONNECTED COUNTERS

CROSS REFERENCE TO RELATED APPLICATION

This application claims the priority of Japanese Application Serial No. 123988/1992, filed May 18, 1992, the subject matter of which is incorporated herein by reference.

BACKGROUND OF THE INVENTION

This invention relates to a synchronous counter circuit, and more specifically to a synchronous counter circuit having a plurality of cascade-connected counters, which is suitable for use in a gate array and a standard cell.

The gate array and the standard cell make up a large logic function circuit using a micro cell library. A synchronous counter circuit is known as the logic function circuit. The synchronous counter circuit comprises a plurality of cascade-connected counters. However, the synchronous counter circuit tends to malfunction when the difference in time between an enable signal output from the counter provided at the preceding stage and a clock signal becomes small.

SUMMARY OF THE INVENTION

It is an object of the present invention to provide a synchronous counter circuit having a plurality of cascade-connected counters, which can be prevented from malfunctioning.

A synchronous counter circuit according to the present invention comprises first and second counting circuits and a latch circuit. Each of the first and second counting circuits includes a clock terminal for receiving a clock signal, an enable terminal for receiving an enable signal, a counter coupled to the clock terminal for counting pulses of the clock signal, a carry signal generating circuit coupled to the counter for generating a carry signal in response to a finish of the counting of the counter, and a ripple carry signal generating circuit coupled to the clock terminal and the carry signal generating circuit for generating a ripple carry signal in response to the clock signal and the carry signal. The latch circuit is coupled to the carry signal generating circuit and the ripple carry signal generating circuit of the first counting circuit for generating another enable signal in response to the carry signal and the ripple carry signal which are output from the carry signal generating circuit and the ripple carry signal generating circuit of the first counting circuit. The latch circuit has an output terminal coupled to the enable terminal of the second counting circuit.

DETAILED DESCRIPTION OF THE PREFERRED EMBODIMENT

Figure 1:
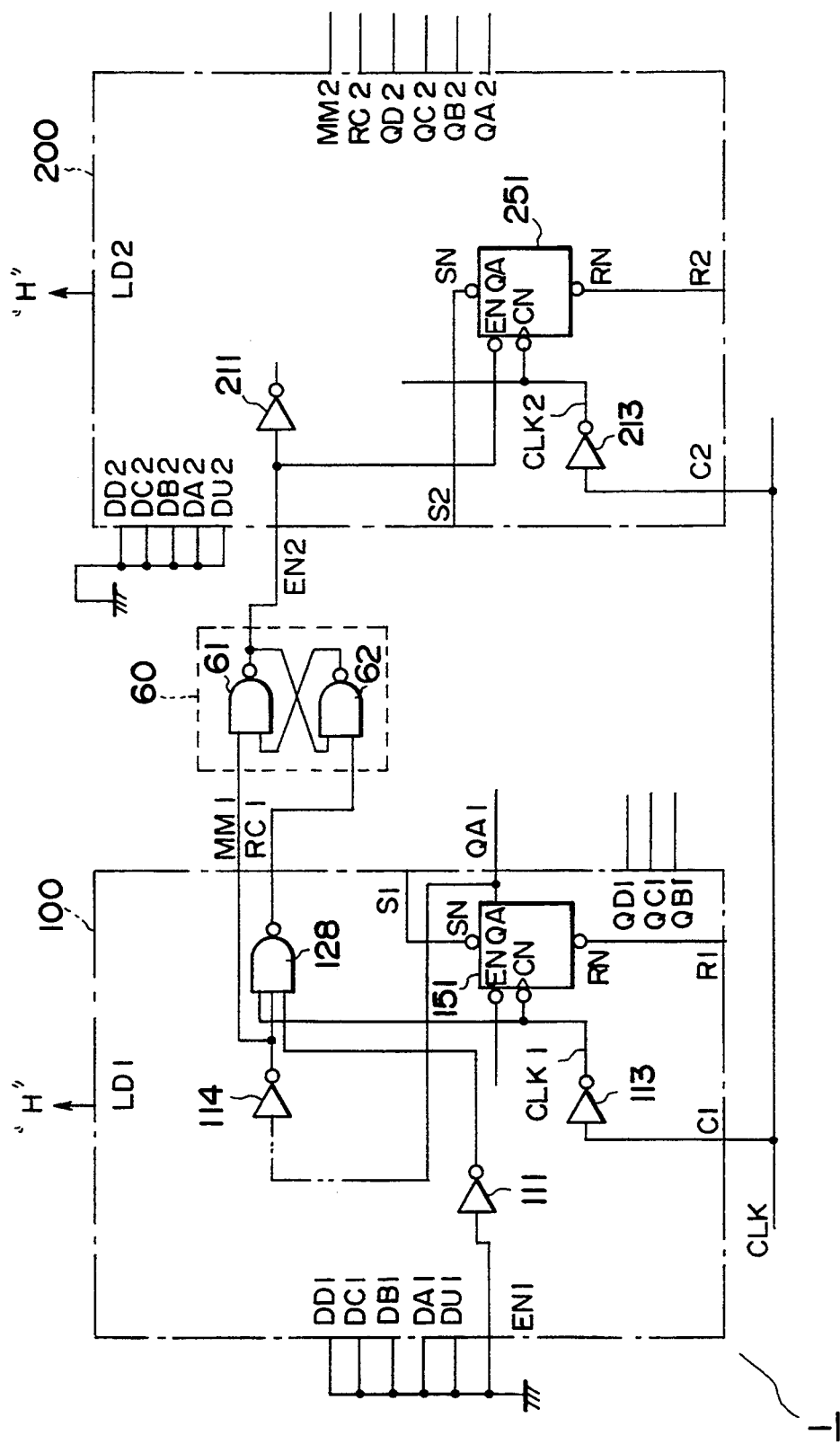
FIG. 1 is a fragmentary circuit diagram showing a 8-bit synchronous counter circuit according to the embodiment of the present invention.

FIG. 1 is a fragmentary circuit diagram showing a synchronous counter circuit according to the embodiment of the present invention. The present embodiment shows a 8-bit synchronous counter circuit 1 comprised of cascade-connected first and second counters 100 and 200.

The 8-bit synchronous counter circuit 1 has first and second 4-bit ripple counters or counting circuits 100 and 200 each constructed using a macro cell library. A data latch circuit 60 is provided between the first and second 4-bit ripple counters 100 and 200.

The first and second 4-bit ripple counters 100 and 200 are identical in circuit configuration to each other. Each of the first and second counters 100 and 200 is illustrated by a circuit diagram shown in FIG. 2.

Figure 2:
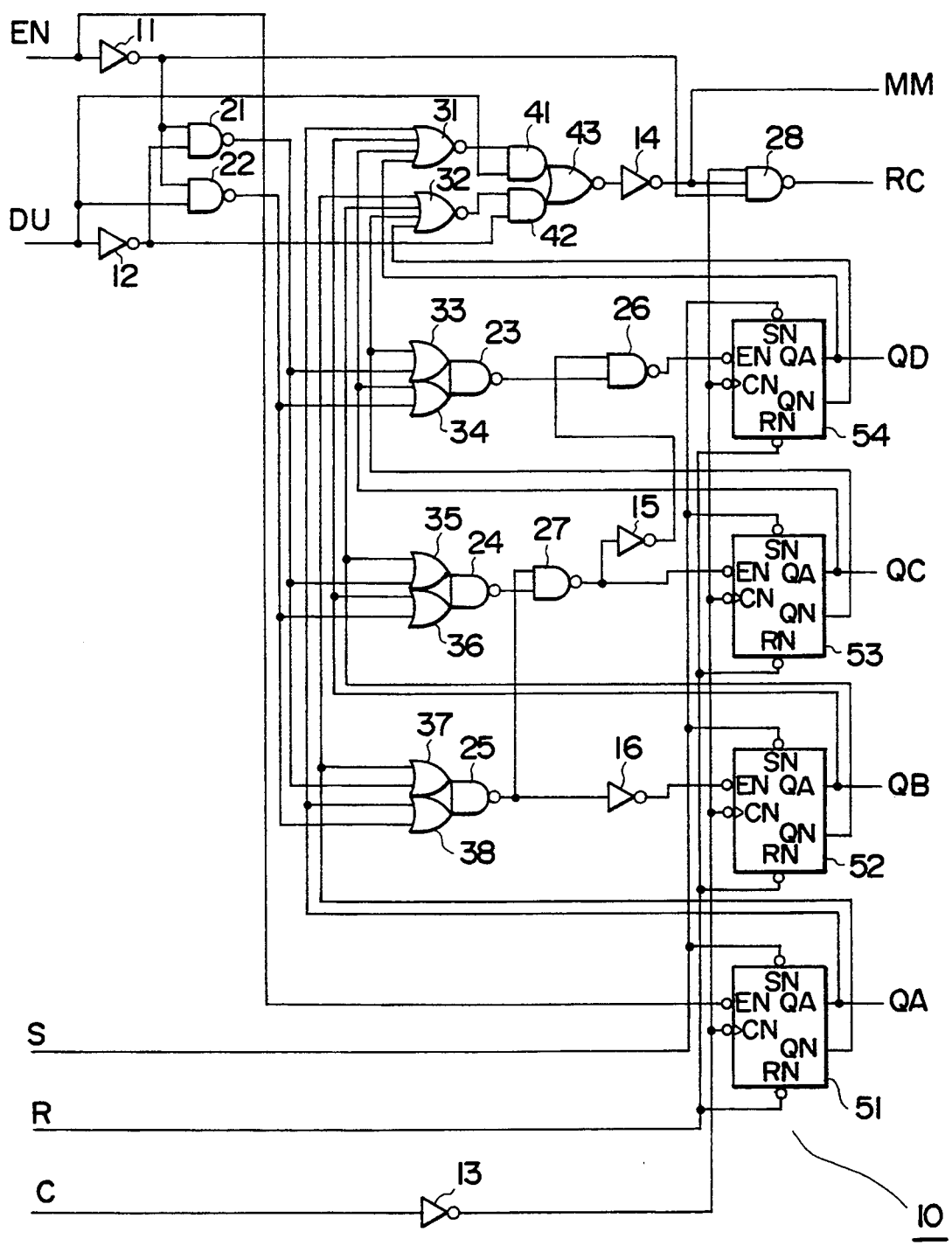
FIG. 2 is a circuit diagram illustrating a counter shown in FIG. 1.

FIG. 2 is a partly cut circuit diagram showing a 4-bit counter or counting circuit 10.

The 4-bit counter 10 comprises signal inverters 11 through 16, two-input NAND gates 21 through 27, a three-input NAND gate 28, four-input NOR gates 31 and 32, two-input OR gates 33 through 38, two-input AND gates 41 and 42, two-input NOR gates 43, and toggle flip-flops (hereinafter called "T-FFs") 51 through 54 having enable functions respectively.

In the 4-bit counter 10, the T-FFs 51 through 54 are electrically cascade-connected to one another. Each of the T-FFs 51 through 54 has an enable terminal EN, a clock terminal CN, a set terminal SN, a reset terminal RN, a data output terminal QA and an inverted data output terminal QN. When each of the enable terminals EN is supplied with an enable signal, each of the T-FFs 51 through 54 starts to operate. A clock signal CLK input to a clock terminal C of the counter 10 is inverted by the inverter 13. Thereafter, the inverted clock signal is input to the clock terminals CN of the T-FFs 51 through 54. The counter 10 counts the number of pulses of the inverted clock signal in response to the inverted clock signal and outputs the counts from respective data output terminals QA through QD. The set terminals SN of the respective T-FFs 51 through 54 are electrically connected to a set terminal S of the counter 10. The respective T-FFs 51 through 54 are set based on a set signal input to the set terminal S of the counter 10. The reset terminals RN of the respective T-FFs 51 through 54 are electrically connected to a reset terminal R of the counter 10. Each of the T-FFs 51 through 54 is reset by a reset signal input to the reset terminal R of the counter 10.

Incidentally, an "H" level signal is supplied to an input terminal LD of the counter 10, and a ground potential is supplied to data input terminals DA through DD.

The description of circuits respectively electrically connected to the data input terminals DA through DD will be omitted because the circuits have no connection with this invention.

A first output QA of the first T-FF 51 is electrically connected to the data output terminal QA of the counter 10. Further, the first output QA of the first T-FF 51 is electrically connected to a first input of the OR gate 38 and a first input of the NOR gate 31. A second output QN of the first T-FF 51 is electrically connected to a first input of an OR gate 37 and a first input of a NOR gate 32. The outputs of the OR gates 37 and 38 are respectively electrically connected to first and second inputs of the NAND gate 25. The output of the NAND gate 25 is electrically connected to the input of an inverter 16 and a first input of a NAND gate 27. The output of the inverter 16 is electrically connected to the enable input EN of the second T-FF 52.

A first output QA of the second T-FF 52 is electrically connected to the data output terminal QB of the counter 10, a first input of the OR gate 36 and a second input of the NOR gate 31. A second output QN of the second T-FF 52 is electrically connected to a first input of the OR gate 35 and a second input of the NOR gate 32. The outputs of the OR gates 35 and 36 are respectively electrically connected to first and second inputs of the NAND gate 24. The output of the NAND gate 27 is electrically connected to the input of the inverter 15 and the enable input EN of the second T-FF 52. The output of the inverter 15 is electrically connected to a first input of the NAND gate 26.

A first output QA of the third T-FF 53 is electrically connected to the data output terminal QC of the counter 10, a first input of the OR gate 34 and a third input of the NOR gate 31. A second output QN of the third T-FF 53 is electrically connected to a first input of the OR gate 33 and a third input of the NOR gate 32. The outputs of the OR gates 33 and 34 are respectively electrically connected to first and second inputs of the NAND gate 23. The output of the NAND gate 23 is electrically connected to a second input of the NAND gate 26. The output of the NAND gate 26 is electrically connected to the enable input EN of the fourth T-FF 54.

A first output QA of the fourth T-FF 54 is electrically connected to the data output terminal QD of the counter 10 and a fourth input of the NOR gate 31. A second output QN of the fourth T-FF 54 is electrically connected to a fourth input of the NOR gate 32. The outputs of the NOR gates 31 and 32 are respectively electrically connected to first inputs of the AND gates 41 and 42. The outputs of the AND gates 41 and 42 are respectively electrically connected to first and second inputs of the NOR gate 43. The output of the NOR gate 43 is electrically connected to the input of the inverter 14. The output of the inverter 14 is electrically connected to a carry terminal MM of time counter 10 and a second input of the NAND gate 28. The output of the NAND gate 28 is electrically connected to a ripple carry terminal RC of the counter 10.

An enable terminal EN of the counter 10 is electrically connected to the input of the inverter 11 and the enable terminal EN of the first T-FF 51. The output of the inverter 11 is electrically connected to first inputs of the NAND gates 21 and 22 and a third input of the NAND gate 28.

An up/down terminal DU of the counter 10 is electrically connected to the input of the inverter 12, a second input of the AND gate 41 and a second input of the NAND gate 22. The output of the inverter 12 electrically connected to a second input of the NAND gate 21 and a second input of the AND gate 12. The output of the NAND gate 21 is electrically connected to second inputs of the OR gates 33, 35 and 37. The output of the NAND gate 22 is electrically connected to second inputs of the OR gates 34, 36 and 38.

Referring back to FIG. 1, the clock signal CLK is input to each of clock terminals C1 and C2 of the first and second counters 100 and 200. An "H" level signal is supplied to input terminals LD1 and LD2 of the first and second counters 100 and 200. An "L" level signal is supplied to data input terminals DA1 through DD1 of the first counter 100, an up/down terminal DU1 and an enable terminal EN1. A carry terminal MM1 and a ripple carry terminal RC1 of the first counter 100 are electrically connected to a latch circuit 60.

The latch circuit 60 latches a ripple carry signal output from the ripple carry terminal RCt of the first counter 100 and outputs it to an enable terminal EN2 of the second counter 200 in the form of an enable signal. Further, the latch circuit 60 has two two-input NAND gates 61 and 62. One of the input terminals of the two-input NAND gate 61 is electrically connected to the carry terminal MM1 of the first counter 100, whereas the other of the input terminals thereof is electrically connected to the output terminal of the NAND gate 62. One of input terminals of the two-input NAND gate 62 is electrically connected to the ripple carry terminal RC1 of the first counter 100, whereas the other of the input terminals thereof is electrically connected to the output terminal of the NAND gate 61. The output terminal of the NAND gate 61 is electrically connected to the enable terminal EN2 of the second counter 200. An "L" level signal is supplied to data input terminals DA2 through DD2 and an up/down terminal DU2 of the second counter 200.

Figure 3:
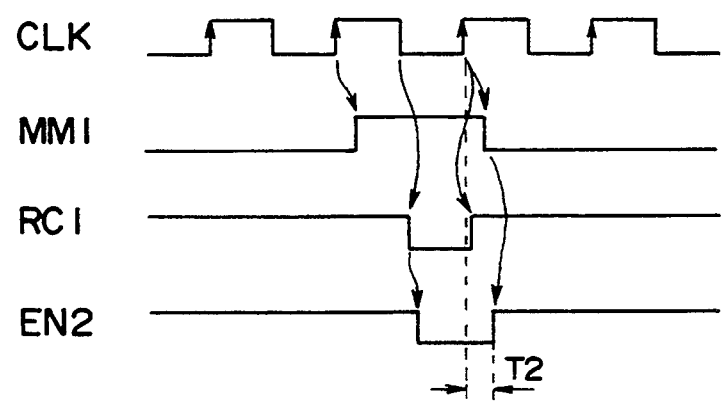
FIG. 3 is a timing chart for describing the operation of the 8-bit synchronous counter circuit depicted in FIG. 1.

FIG. 3 is a timing chart for explaining the operation of the 8-bit synchronous counter circuit shown in FIG. 1. The operation of the 8-bit synchronous counter circuit 1 will be described below with reference to FIG. 3.

Incidentally, "100" is added to reference numerals indicative of the respective elements which are employed in the first counter 100 and correspond to those shown in FIG. 2 in order to distinguish the elements employed in the first counter 100 from those employed in the second counter 200. Further, "200" is added to reference numerals indicative of the respective elements employed in the second counter 200. A CLK1 in the first counter 100 is used as a signal obtained by inverting the clock signal CLK with an inverter 113. Further, a CLK2 in the second counter 200 is used as a signal obtained by inverting the clock signal CLK with an inverter 213.

When the clock terminals C1 and C2 of the first and second counters 100 and 200 are supplied with the clock signal CLK, the T-FFs 151 through 154 of the first counter 100 are activated in response to the rise (fall of the clock signal CLK1) of the clock signal CLK so as to count the number of pulses of the clock signal CLK (clock signal CLK1). When the first counter 100 counts up to its maximum value or counts down to its minimum value, a carry signal supplied to the carry terminal MM1 from an inverter 114 through a plurality of gate circuits shown in FIG. 2 is brought to an "H" level in synchronism with the clock signal CLK and to an "L" level in synchronism with the rise of the next clock signal CLK.

The carry signal output from the inverter 114 is input to a three-input NAND gate 128. The NAND gate 128 is supplied with the inverted clock signal CLK1 obtained by inverting the clock signal CLK with the inverter 113 and an inverted enable signal obtained by inverting the enable signal input from the enable terminal EN1 of the counter 100 with an inverter 111. Therefore, the ripple carry signal output to the ripple carry terminal RC1 from the NAND gate 128 is taken "H" in level when the carry signal is brought to an "H" level and taken "L" in level in synchronism with the fall of the clock signal CLK. Further, the ripple carry signal is brought to the "H" level in synchronism with the rise of the next clock signal CLK.

The signals output from the carry terminal MM1 and the ripple carry terminal RC1 of the first counter 100 are sent to the latch circuit 60. The latch circuit 60 latches the ripple carry signal supplied from the ripple carry terminal RC1 and outputs an enable signal which falls in synchronism with the fall of the ripple carry signal, to the enable terminal EN2 of the second counter 200. When the carry signal output from the carry terminal MM1 of the first counter 100 is brought to the "L" level, the enable signal output from the latch circuit 60 is brought to the "H" level and output to the enable terminal EN2 of the counter 200.

When such an enable signal is input to the enable terminal EN2 of the second counter 200, T-FFs 251 through 254 of the counter 200 are activated to count up or down the number of pulses of the clock signal CLK input from the clock terminal C2. Then, the T-FFs 251 through 254 output the counts to data output terminals QA2 through QD2 respectively.

In the 8-bit synchronous counter circuit according to the present embodiment, the latch circuit 60 is provided between the first counter 100 and the second counter 200. Therefore, the signal input to the enable terminal EN2 of the second counter 200 depends on the signal output from the carry terminal MM1 of the first counter 100 without relying on the timing at which the signal is output from the ripple carry terminal RC1 of the first counter 100. Thus, since a time interval T2 required to hold the enable signal and the clock signal input to the T-FFs 251 through 254 of the second counter 200 is sufficiently long, the T-FFs 251 through 254 can be reliably activated so as to prevent the 8-bit synchronous counter circuit from malfunctioning.

Further, the latch circuit 60 produces, as the enable signal to be supplied to the second counter 200, the ripple carry signal latched in predetermined timing based on the carry signal output from the first counter 100 without producing, as the enable signal to be supplied to the second counter 200, a signal obtained by simply delaying the ripple carry signal output from the ripple carry terminal RC1 of the first counter 100. Thus, the timing between the first and second counters 100 and 200 can be easily made. Further, a sufficient holding time interval T2 can be ensured by a simple circuit configuration like the latch circuit 60.

Incidentally, the present invention is not necessarily limited to the above embodiment. Various modifications can be made. For example, the number of bits of each of the first and second counters 100 and 200 and the number of bits of the synchronous counter circuit may respectively be changed to the desired number of bits other than 4 bits and the other number of bits.

Having now fully described the invention, it will be apparent to those skilled in the art that many changes and modifications can be made without departing from the spirit or scope of the invention as set forth herein.

What is claimed is:

1. A synchronous counter circuit comprising:
   (a) first and second counting circuits, each including
   (1) a clock terminal for receiving a clock signal,
   (2) an enable terminal for receiving an enable signal,
   (3) a counter, coupled to the clock terminal, for counting pulses of the clock signal,
   (4) a carry signal generating circuit, coupled to the counter for generating a carry signal in response to a finish of the counting of the counter, and
   (5) a ripple carry signal generating circuit, coupled to the clock terminal and the carry signal generating circuit, for generating a ripple carry signal in response to the clock signal and the carry signal; and
   (b) a latch circuit, coupled to the carry signal generating circuit and the ripple carry signal generating circuit of said first counting circuit, for generating another enable signal in response to the carry signal and the ripple carry signal which are output from the carry signal generating circuit and the ripple carry signal generating circuit of said first counting circuit, said latch circuit having an output terminal coupled to the enable terminal of the second counting circuit.

2. A synchronous counter circuit according to claim 1, wherein the ripple carry signal generating circuit is further coupled to the enable terminal and generates the ripple carry signal in response to the clock signal, the carry signal and the enable signal.

3. A synchronous counter circuit according to claim 2, wherein the ripple carry signal generating circuit is a three-input NAND circuit having a first input coupled to the clock terminal, a second input coupled to the carry signal generating circuit, a third input coupled to the enable terminal and an output coupled to said latch circuit.

4. A synchronous counter circuit according to claim 1, wherein the counter is a ripple counter including a plurality of flip-flops.

5. A synchronous counter circuit according to claim 1, wherein the latch circuit includes
   a first NAND circuit having an output coupled to the output terminal of said latch circuit, a first input coupled to the carry signal generating circuit of the first counting circuit and a second input and
   a second NAND circuit having an output coupled to the second input of the first NAND circuit, a first input coupled to the ripple carry generating circuit of the first counting circuit and a second input coupled to the output of the first NAND circuit.

6. A synchronous counter circuit according to claim 1, wherein the carry signal generating circuit is a gate circuit having a plurality of inputs coupled to outputs of the counter.

7. A synchronous counter circuit according to claim 1, wherein in each of said first and second counting circuits, said counter is coupled to said enable terminal and is responsive to the enable signal for counting the pulses of the clock signal.

8. A synchronous counter circuit comprising:
   (a) a first counting circuit, enabled in response to a first enable signal, said first counting circuit including
   (1) a clock terminal for receiving a clock signal,
   (2) a first enable terminal for receiving the first enable signal,
   (3) a carry terminal for outputting a carry signal,
   (4) a ripple carry terminal for outputting a ripple carry signal,
   (5) a counter, coupled to the clock terminal, for counting pulses of the clock signal,
   (6) a carry signal generating circuit, coupled to the carry terminal and the counter, for generating the carry signal in response to a finish of the counting of the counter, and (7) a ripple carry signal generating circuit, coupled to the clock terminal, the first enable terminal, the carry terminal and the ripple carry terminal, for generating the ripple carry signal in response to the clock signal, the first enable signal and the carry signal;

(b) a second counting circuit, enabled in response to a second enable signal, said second counting circuit including a second enable terminal for receiving the second enable signal; and (c) an enable signal generating circuit, coupled to the carry terminal, the ripple carry terminal and the second enable terminal, for generating the second enable signal in response to the carry signal and the ripple carry signal.

9. A synchronous counter circuit according to claim 7, wherein the counter is a ripple counter including a plurality of flip-flops.

10. A synchronous counter circuit according to claim 8, wherein the enable signal generating circuit includes a first NAND circuit having an output coupled to the second enable terminal, a first input coupled to the carry terminal and a second input and a second NAND circuit having an output coupled to the second input of the first NAND circuit, a first input coupled to the ripple carry terminal and a second input coupled to the output of the first NAND circuit.

11. A synchronous counter circuit according to claim 8, wherein the ripple carry signal generating circuit is a three-input NAND circuit having a first input coupled to the clock terminal, a second input coupled to the carry terminal, a third input coupled to the enable terminal and an output coupled to the ripple carry terminal.

12. A synchronous counter circuit according to claim 8, wherein the carry signal generating circuit is a gate circuit having a plurality of inputs coupled to outputs of the counter.

13. A synchronous counter circuit according to claim 8, wherein said counter of said first counting circuit is coupled to said first enable terminal and is responsive to the first enable signal for counting the pulses of the clock signal.

14. A synchronous counter circuit, enabled in response to an input enable signal, comprising:

a clock terminal for receiving a clock signal;

an enable terminal for receiving the input enable signal;

a counter, coupled to the clock terminal, for counting pulses of the clock signal, the counter having a plurality of output terminals for outputting count signals;

a carry signal generating circuit, coupled to the output terminals of the counter, for generating a carry signal in response to the count signals;

a ripple carry signal generating circuit, coupled to the clock terminal and the carry signal generating circuit, for generating a ripple carry signal in response to the clock signal and the carry signal; and an enable signal generating circuit, coupled to the carry signal generating circuit and the ripple carry signal generating circuit, for generating an output enable signal in response to the carry signal and the ripple carry signal.

15. A synchronous counter circuit according to claim 14, wherein the ripple carry signal generating circuit is further coupled to the enable terminal and generates the ripple carry signal in response to the clock signal, the carry signal and the input enable signal.

16. A synchronous counter circuit according to claim 15, wherein the ripple carry signal generating circuit is a three-input NAND circuit having a first input coupled to the clock terminal, a second input coupled to the carry terminal, a third input coupled to the enable terminal and an output coupled to the enable signal generating circuit.

17. A synchronous counter circuit according to claim 14, wherein the counter is a ripple counter including a plurality of flip-flops.

18. A synchronous counter circuit according to claim 14, wherein the enable signal generating circuit includes a first NAND circuit having an output coupled to the enable terminal, a first input coupled to the carry terminal and a second input and a second NAND circuit having an output coupled to the second input of the first NAND circuit, a first input coupled to the ripple carry terminal and a second input coupled to the output of the first NAND circuit.

19. A synchronous counter circuit according to claim 14, wherein the carry signal generating circuit is a gate circuit having a plurality of inputs coupled to outputs of the counter.

20. A synchronous counter circuit according to claim 14, wherein said counter is coupled to said enable terminal and is responsive to the enable signal for counting the pulses of the clock signal.

* * * * *